United States Patent [19]

Proebsting

[11] Patent Number: 5,546,338
[45] Date of Patent: Aug. 13, 1996

[54] FAST VOLTAGE EQUILIBRATION OF DIFFERENTIAL DATA LINES

[75] Inventor: Robert J. Proebsting, Los Altos Hills, Calif.

[73] Assignee: Townsend and Townsend Khourie and Crew, San Francisco, Calif.

[21] Appl. No.: 438,148

[22] Filed: May 9, 1995

Related U.S. Application Data

[63] Continuation of Ser. No. 297,723, Aug. 26, 1994.

[51] Int. Cl.⁶ .................................................. G11C 13/00
[52] U.S. Cl. ............... 365/181; 365/189.07; 365/189.09; 365/203; 365/207
[58] Field of Search ..................................... 365/181, 202, 365/203, 207, 189.01, 230.01, 189.05, 189.07, 189.09

[56] References Cited

U.S. PATENT DOCUMENTS

| | | | |
|---|---|---|---|
| 4,689,771 | 8/1987 | Wang et al. | 365/189 |
| 5,121,356 | 6/1992 | Park et al. | 365/203 |
| 5,250,854 | 10/1993 | Lien | 365/203 |
| 5,418,748 | 5/1995 | Monden | 365/203 |

*Primary Examiner*—Terrell W. Fears
*Attorney, Agent, or Firm*—Townsend and Townsend and Crew

[57] ABSTRACT

A method and a circuit for fast equilibration of complementary data lines in memory circuit following a write cycle. The circuit of the present invention separately controls the on/off timing of pull-up and pull-down transistors coupled to the data lines to obtain faster equilibration. In one embodiment incorporating an equilibration transistor between the data lines, the pull-up transistor coupled to the high data line is momentarily turned off after a write cycle, to allow the voltage on the high data line to drop all the way down to the voltage on the recovering low data line to reduce equilibration delay.

19 Claims, 4 Drawing Sheets

FAST VOLTAGE EQUILIBRATION OF DIFFERENTIAL DATA LINES

This is a continuation of application Ser. No. 08/297,723 filed Aug. 26, 1994 pending.

BACKGROUND OF THE INVENTION

The present invention relates in general to integrated circuit memories, and in particular to a method and circuit for providing fast equilibration of complementary data lines following a write cycle.

In both dynamic and static random access memory circuits, a memory read operation relies on the ability to sense a small differential voltage across a complementary pair of input/output (I/O) data lines. To minimize read access time from memory cell selection to differential signal generation, the lines must be equilibrated before cell selection. While a read operation causes a voltage differential of typically a few hundred millivolts across the I/O data lines, a write operation causes a full logic level differential voltage (i.e., the power supply voltage of 3 to 5 volts). Because the differential voltage on the I/O data lines is much larger in the case of a write operation, equilibration of the I/O data lines after a write cycle requires a longer time compared to the time required for equilibration after a read cycle. The operation of the memory circuit thus slows down when performing a read cycle immediately following a write cycle.

Consider the I/O data path for a typical dynamic random access memory (DRAM) shown in FIG. 1. Memory cells 100 are located at the cross section of word (or row) lines 102 and bit (or column) lines 104. To read the contents of a given memory cell 100, the memory circuit receives address information corresponding to the location of that memory cell. Upon decoding the address information, the word line connecting to the cell is selected and the memory cell is accessed. At this time a charge storage element 106 in memory cell 100 couples to the associated bit line causing charge sharing to occur between the charge storage element 106 and the parasitic capacitance on bit line 104. A sense amplifier 105 connecting to the selected bit line and it's complement detects the resulting voltage differential and amplifies the signal to full logic levels (i.e. ground and power supply voltage). Thus, at the completion of the sensing operation, opposite polarity logic levels develop on the pair of bit lines.

In DRAM circuits, a pair of complementary I/O data lines 108 typically connect to numerous column lines 104 via column decode transistors 110. To connect the column line with the accessed memory cell to I/O data lines 108, the respective column decode transistors 110 are activated. The complementary bit lines then connect to the complementary pair of I/O data lines 108 allowing the information to be transferred from the bit lines onto I/O data lines 108 in a read cycle, or from the I/O lines onto the bit lines in a write cycle. In a read cycle, a differential sense amplifier 112 receives complementary I/0 data lines 108 at its inputs and generates the output data at its output. Before connecting to the bit lines, I/O data lines 108 are charged to an equal voltage. This is typically accomplished by a pair of PMOS pull-up transistors 114C and 114T connecting each I/O data line to the positive supply voltage VDD. For the purpose of this description, it is assumed that both PMOS pull-up transistors 114C and 114T remain on during read cycle. Once the column decode signal is asserted and the bit lines connect to I/O data lines 108, approximately 1 mA of current flows through the pull-up PMOS transistor 114 that connects to the low going I/O data line. With an effective resistance for PMOS pull-up transistor 114 of a few hundred ohms, the current causes a voltage drop of a few hundred millivolts below VDD on the low going I/O data line. The complementary I/O data line remains at VDD. This differential voltage is then sensed and amplified by differential sense amplifier 112 to generate the output data.

To read the contents of another memory cell 100 (in the same row but a different column) following a first read cycle, there must therefore be enough time allowed for I/O data lines 108 to equilibrate. This will require a relatively short time delay since after a read operation, the I/O data lines are only a few hundred millivolts (e.g. 400 mv) apart. To read the contents of a memory cell 100 immediately after a write cycle, however, data line equilibration requires a significantly longer time delay. This is due to the fact that the write cycle brings the potential on complementary I/O data lines 108 to full logic levels (i.e., ground and VDD). When writing a logical "0" NMOS pull-down transistor 116T is turned on to connect the true data line 108 to ground, while PMOS pull-up transistor 114T is turned off to disconnect the true data line from VDD. The NMOS pull-down transistor 116C remains off and the PMOS pull-up transistor 114C remains on for the complementary data line. When writing a logical "1" NMOS pull-down transistor 116C is on to connect the complementary data line to ground while PMOS pull-up transistor 114C is turned off to disconnect this line from VDD. In this case, the NMOS pull-down transistor 116T remains off and the PMOS pull-up transistor 114T remains on for the true data line. When an array is selected, at all times except when writing, both PMOS transistors 114 are turned on and both NMOS pull-down transistors 116 are turned off to pull both I/O data lines 108 up to VDD (in the absence of read current). Thus, to equilibrate the voltage on the I/O data lines for a read cycle after a write cycle, the data line carrying a logic low signal must be pulled up several volts (typically 3 to 5 volts) instead of a few hundred millivolts.

FIG. 2 is a timing diagram showing the voltage on the I/O data lines for memory read and write cycles. The column decode signal is shown by signal 2A defining the timing of a read or write cycle. Signal 2B shows the voltage on the I/O data lines during a read cycle, while signal 2C shows the voltage on the I/O data lines during a write cycle. As can be seen from the diagram, a read operation can start at time $t_1$(signal 2B) when the data lines have equilibrated after a read cycle. After a write cycle, however, because the voltage differential is much greater, a read operation can not occur until a considerably later time $t_3$ (signal 2C) when equilibration occurs.

A similar problem exists in the case of static random access memory (SRAM) circuits. Data input and output typically take place on the same set of data lines. The circuit for an SRAM is similar to that shown in FIG. 1 without the memory cells 100, if one considers sense amplifier 105 as the SRAM memory cell flip flop, decode transistors 110 as SRAM cell access transistors, and I/O data lines 108 as SRAM bit lines. There is therefore an identical equilibration delay problem for a read cycle immediately following a write cycle in the case of an SRAM.

Existing memory circuits therefore suffer from an additional delay when a read operation takes place immediately after a write operation. This problem would be avoided if the I/O data lines were not shared and the input and output paths were separate. However, because separate I/O paths would significantly increase the circuit area, the I/O paths are commonly not separated.

One way to reduce the equilibration delay is to reduce the effective resistance value of the PMOS pull-up transistors 114. This reduces the RC time constant and speeds up the recovery of the low I/O data line. However, smaller resistance reduces the voltage differential that develops between the complementary data lines during a read cycle. For proper operation, the differential amplifier requires a minimum ΔV at its inputs. Given smaller effective pull-up resistance, to obtain a sufficiently large ΔV would require larger read currents. To obtain larger read currents, column decode transistors 110 must be made larger. Larger decode transistors 110, however, directly add to the parasitic capacitance on I/O data lines 108, causing the RC time constant to increase. This is therefore not a viable option.

A modification to this approach uses large (low resistance) pull-up transistors for moderately fast equilibration, and turns off these transistors during the following read cycle. This approach, however, uses significant area for the large transistors and requires very critical timing for turning off the large pull-up transistors.

A much better approach to reducing the data line equilibration delay requires the addition of an NMOS equilibration transistor 118 that shorts the two data lines together when turned on. When the complementary data lines are shorted together, current flows through equilibration transistor 118, moving the voltage on the high data line down toward the recovering low data line while at the same time speeding up the recovery of the low data line. When the voltage on the recovering low data line reaches a high enough value such that the gate-to-source voltage of NMOS equilibration transistor 118 goes below a threshold voltage, equilibration transistor 118 turns itself off (even though its gate is still at VDD), at which point both data lines move toward VDD independently. Equilibration transistor 118 therefore turns off in time to avoid any interference with the differential voltage that will develop across the data lines due to the read operation. Equilibration transistor 118 can thus be large to obtain fast equilibration. This significantly reduces the equilibration delay since the voltage on the low data line rises faster while the voltage on the high data line drops somewhat toward the voltage on the low data line. This is illustrated by signal 2D of FIG. 2 which shows the voltage on the I/O line moving toward the voltage on the Ī/Ō line to equilibrate at time $t_2$, earlier than time $t_3$. However, there still remains a small differential voltage between the I/O lines throughout their exponential rise toward VDD. Thus, this reduction in the data line equilibration delay is still not enough for very high speed operation.

There is therefore a need for a faster data line equilibration technique following a write cycle in memory circuits.

SUMMARY OF THE INVENTION

The present invention provides a method and a circuit for fast equilibration of data lines following a write cycle in memory circuits. In one embodiment, the present invention includes an equilibration transistor and furthermore momentarily disables the PMOS pull-up transistor coupled to the high data line during the recovery of the low data line after a write cycle. By the combination of disconnecting the high data line from VDD and activating the equilibration transistor, the high data line discharges through the data line equilibration transistor toward the rising low data line. With the high data line PMOS pull-up transistor disabled, the high data line is pulled down until either the low data line rises above the high data line or until the equilibration transistor turns off. In either case, the rising low data line would eventually rise above the high data line if the high data line PMOS pull-up transistor were to remain off. But the PMOS pull-up transistor on the high data line is reactivated at the moment the rising voltage on the low data line reaches the voltage on the high data line. This allows the two data lines to thereafter charge up to VDD in unison.

An alternate embodiment of the present invention momentarily turns on the NMOS pull-down transistor coupled to the high data line during write recovery of the low data line. The NMOS pull-down transistor 116T is normally turned on only for writing a logic "0" on the data line. But if turned on very briefly during data line recovery following write of a "1", it speeds up the equilibration process by lowering the voltage on the high (true) data line. The NMOS pull-down transistor is preferably turned on only for the amount of time required for the high data line to meet the recovering low data line.

A third embodiment of the present invention combines the above two embodiments by momentarily turning off the PMOS pull-up transistor and turning on the NMOS pull-down transistor connected to the high data line during the recovery period.

Accordingly, in one embodiment, the present invention provides in a memory circuit having a first and a second complementary data lines, with a pull-up transistor and a pull-down transistor coupled to each of the data lines, a method of equilibrating the voltage on the complementary data lines after a write cycle which includes the steps of: (a) turning on the pull-up transistor coupled to the first data line carrying a logic low voltage; (b) shorting the complementary data lines together by activating an equilibration transistor; and (c) momentarily turning off the pull-up transistor coupled to the second data line carrying a logic high voltage.

In another embodiment, the present invention provides in a memory circuit having a first and a second complementary data lines, a circuit for equilibrating the voltage on the data lines including an equilibration transistor having a first and a second terminal respectively coupled to the first and second data lines, a first pull-up transistor and a first pull-down transistor coupled to the first data line, a second pull-up transistor and a second pull-down transistor coupled to the second data line, and control means coupled to the pull-up and pull-down transistors for turning off the pull-up transistor coupled to the first data line carrying a high logic level during the initial recovery from a write cycle of the second I/O data line.

A better understanding of the nature and advantages of the fast data line equilibration technique of the present invention may be had by referring to the diagrams and the detailed description below.

DESCRIPTION OF THE SPECIFIC EMBODIMENTS

Figure 1:
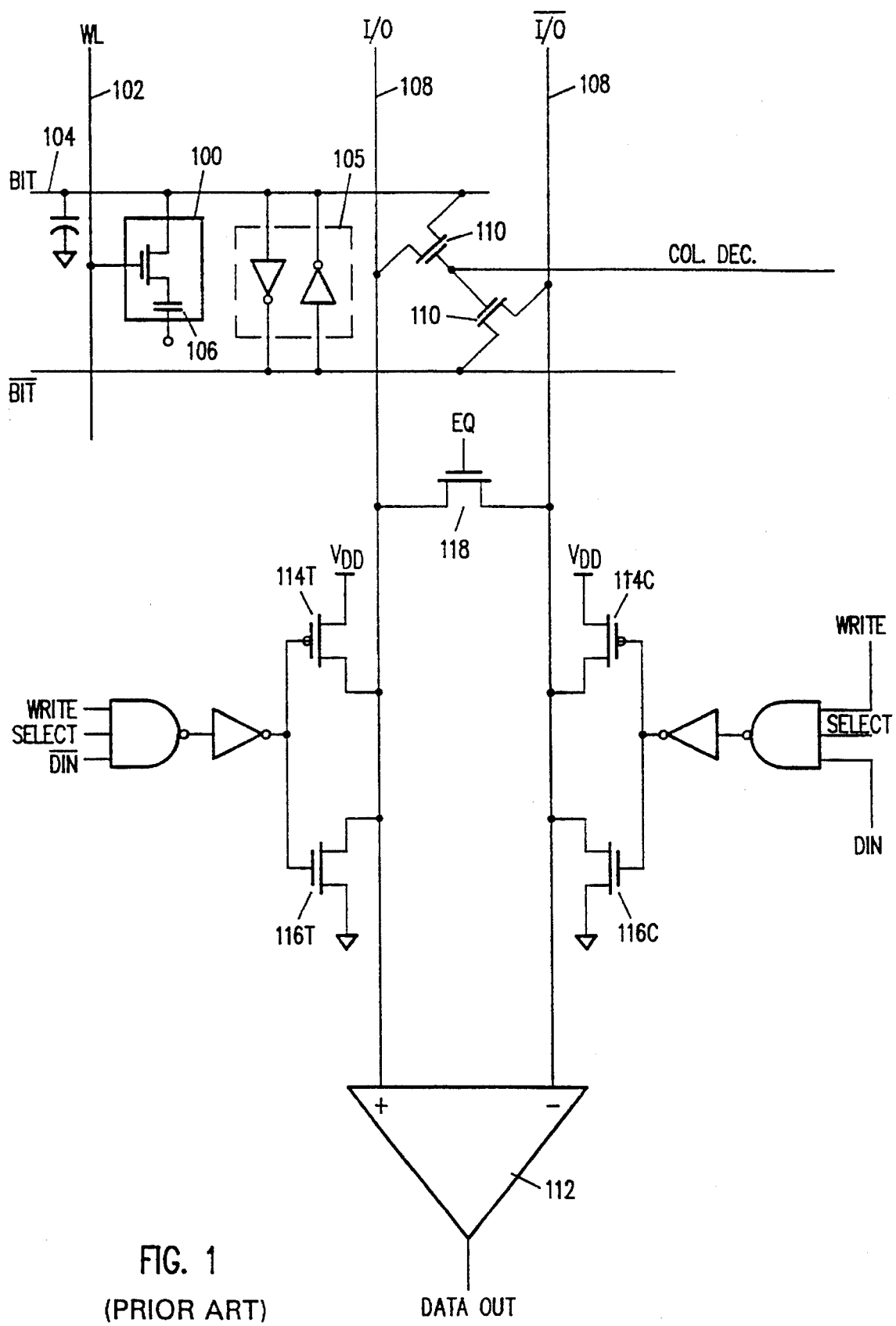
FIG. 1 is a prior art circuit schematic showing the read and write circuitry for an I/O line in a memory circuit.
Figure 2:
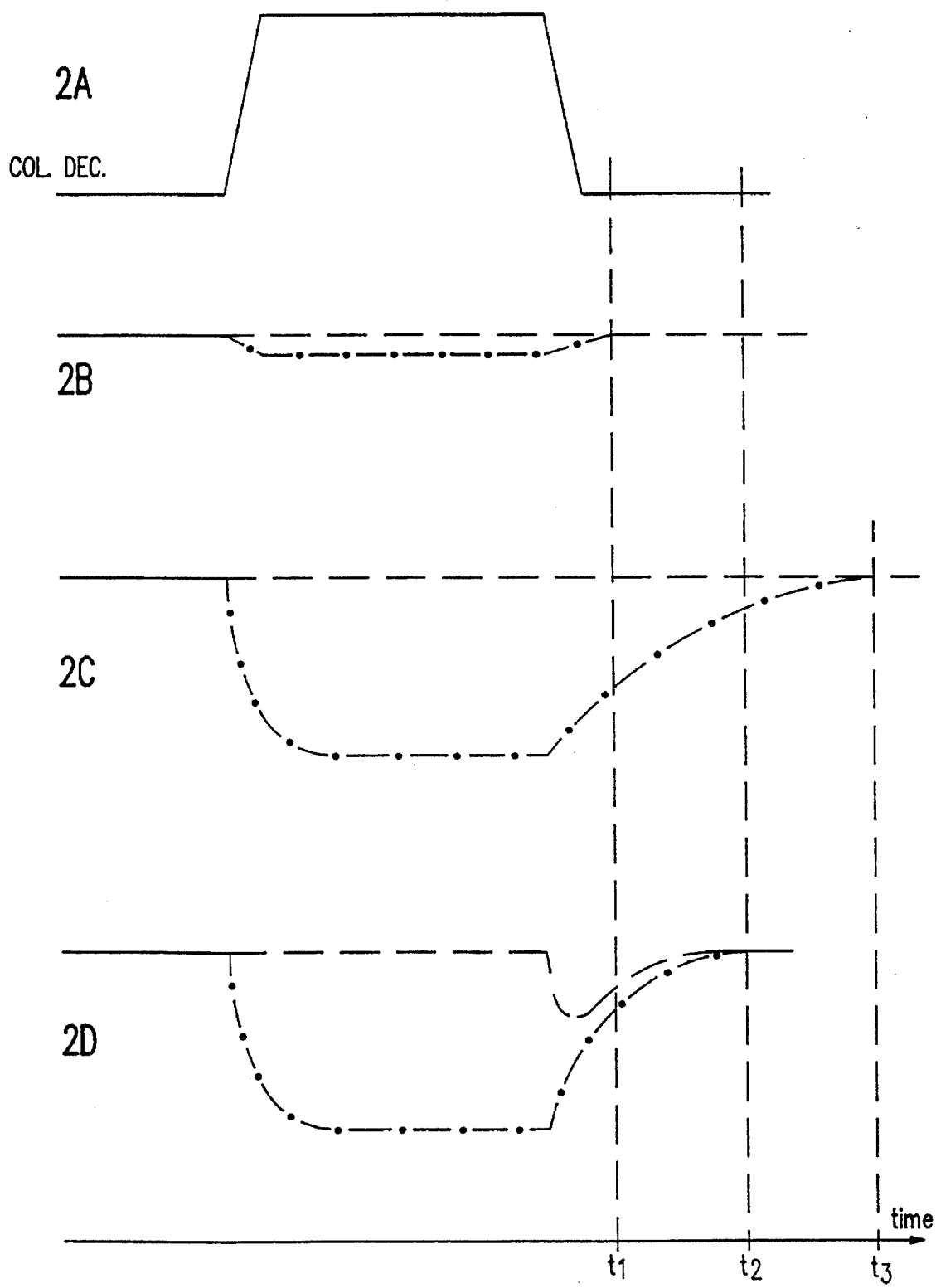
FIG. 2 is a timing diagram illustrating the waveform on the I/O data lines during memory write cycles for the prior art circuit of FIG. 1.

In prior art memory circuits, an example of which is shown in FIG. 1, for the purposes of a write operation, the same signal typically controls the gate terminals of each complementary pair of pull-up and pull-down transistors 114 and 116 that connect to the I/O lines. Accordingly, prior art circuits turn a pull-up transistor 114 off at the same time it's pull-down transistor 116 is turned on, and vice versa. It is to be understood, however, that I/O lines are sometimes both allowed to float after equilibration as a read signal is being developed. But, for the purposes of a write operation, each pair of pull-up and pull-down transistors acts essentially as a conventional inverter. The present invention drastically reduces the equilibration time required for a read operation following a write cycle by separating the connections to the gate terminals of the pull-up and pull-down transistors, and independently controlling the on/off timing of these transistors.

Figure 3:
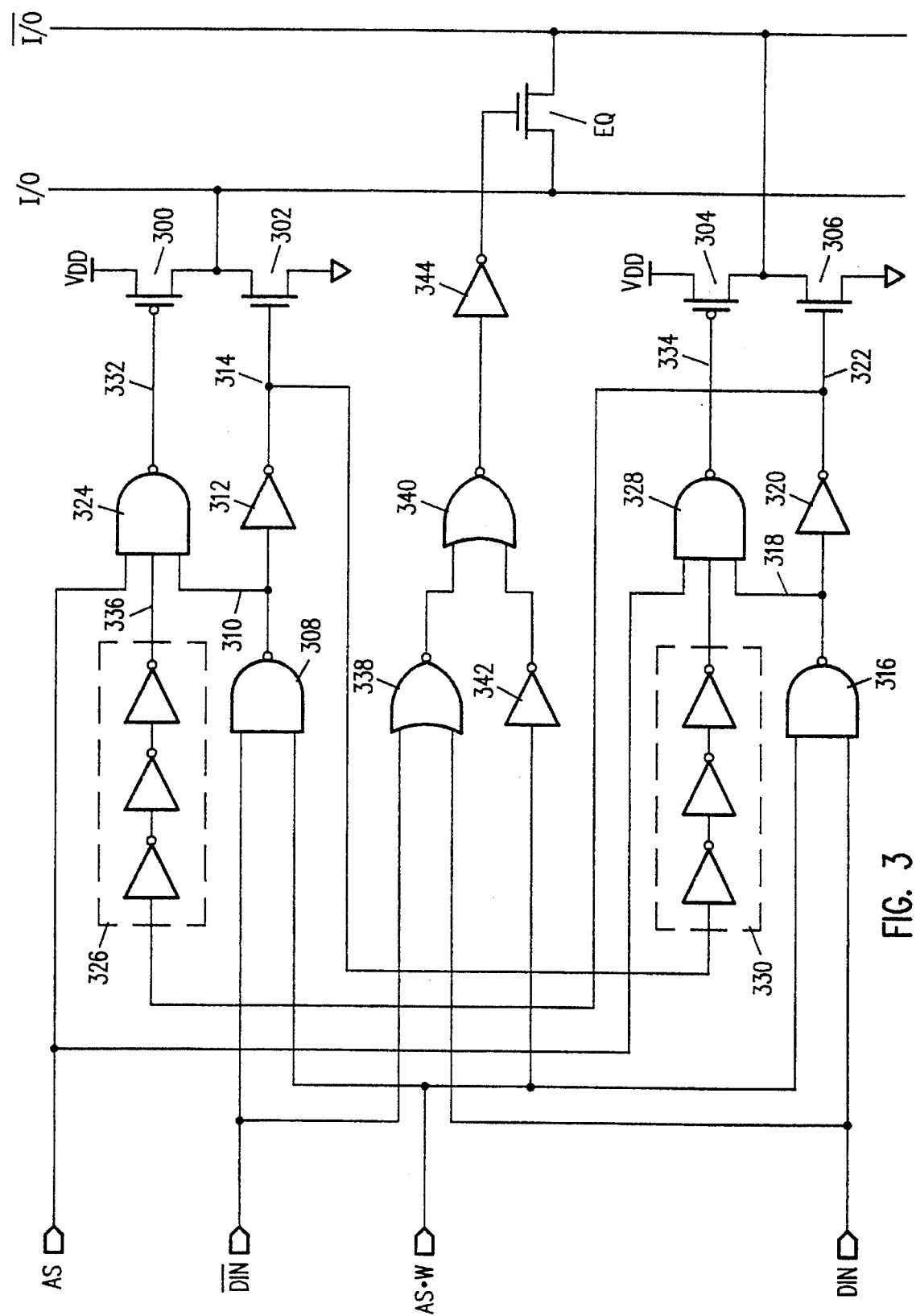
FIG. 3 shows a specific embodiment of the data line equilibration circuit of the present invention.

FIG. 3 shows the memory I/O control circuit according to one embodiment of the present invention. The I/O control circuit includes a PMOS pull-up transistor 300 and an NMOS pull-down transistor 302 connected to an I/O line, and a similar pair, PMOS 304 and NMOS 306, connected to an $\overline{I/O}$ line. The circuit receives an array select signal AS as one input, an array select logically ANDed with write enable signal AS·W as another input, and DIN and $\overline{DIN}$ that supply the write data. The write data is in the form of a pulse (in this example a positive pulse) on either DIN or $\overline{DIN}$, and when not writing both DIN and $\overline{DIN}$ are at the same level (in this example low). The array select signal when deselected allows both I/O and $\overline{I/O}$ to float. This may be required for some array architectures but is not relevant to the equilibration technique being described herein, and will not be further described. The array select signal AS is asserted high when the array is selected for reading or writing, while AS·W is asserted only when writing in the selected array. The control circuit for the true I/O line includes a two-input NAND gate 308 that receives signals AS·W and $\overline{DIN}$ at its inputs. The output of NAND 308, node 310, connects to the input of an inverter 312 whose output, node 314, drives the gate terminal of NMOS pull-down transistor 302. The $\overline{I/O}$ control circuit includes a similar circuit, made up of NAND gate 316 and inverter 320 driving the gate terminal of NMOS pull-down transistor 306, with DIN substituted for $\overline{DIN}$ as an input of NAND gate 316. The gate terminal of PMOS pull-up transistor 300, node 332, is driven by the output of a three-input NAND gate 324. A first input of NAND gate 324 connects to the array select signal AS, while a second input connects to the output of NAND gate 308, node 310. The third input at node 336 is driven by the output of a three-inverter delay chain 326. The input of three-inverter delay chain 326 connects to the output of inverter 320, node 322. A symmetrically connected similar circuit made up of a three-inverter delay chain 330 and a three-input NAND gate 328 drives PMOS pull-up transistor 304. The I/O control circuit further includes an NMOS equilibration transistor EQ whose source and drain terminals connect to I/O and $\overline{I/O}$, respectively. A two-input NOR gate 338 receives DIN and $\overline{DIN}$ at its inputs, and an inverter 342 receives AS·W at its input. A second two-input NOR gate 340 receives the outputs of NOR gate 338 and inverter 342 at its inputs. The output of NOR gate 340 connects to the input of an inverter 344 whose output drives the gate terminal of NMOS transistor EQ. Alternatively, a PMOS transistor may be used as the equilibration transistor. In that case, the circuit driving the gate of the PMOS equilibration transistor would have an inverted logic as compared to that shown in FIG. 3.

The operation of the circuit will be described hereinafter. When the memory circuit is not performing a write operation (i.e., during read or operations other than a write), the signals AS·W, DIN and $\overline{DIN}$ are at logic low level. This will result in a logic low level at the outputs of inverters 312 and 320. Thus, NMOS pull-down transistors 302 and 306 are turned off. If the array is selected (i.e., AS is asserted), all inputs of NAND gates 324 and 328 are at logic high level, causing a low output on nodes 332 and 334, and thereby turning on PMOS pull-up transistors 300 and 304. Therefore, during a read operation or an operation other than a write, both NMOS pull-down transistors 302 and 306 are off and both PMOS pull-up transistors 300 and 304 are on, pulling both I/O lines up to the positive power supply VDD. The equilibration transistor EQ has a high voltage on its gate since all signals DIN, $\overline{DIN}$, and AS·W are low, but it is off since the source and drain terminals are at the same high voltage as the gate terminal.

Now consider the case where a logic "1" is being written into a memory cell coupled to the selected array. A positive pulse is applied to DIN, and AS and AS·W are asserted, while $\overline{DIN}$ remains low. With a high at one input and a positive pulse at the other input of NAND gate 316, a negative pulse appears at its output, node 318. The negative pulse at node 318 is inverted by inverter 320 and is applied to the gate terminal of NMOS pull-down transistor 306. Assuming the rising (leading) edge of the DIN pulse occurs at time $t_O$, NMOS transistor 306 is turned on at time $t_O$ plus two gate delays (316 and 320). The negative pulse at node 318 also causes the output of three-input NAND gate 328 to go high for the duration of the pulse, turning off PMOS transistor 304 two gate delays (316 and 328) after $t_O$. Representing each gate delay by $\Delta$, $\overline{I/O}$ is thus, pulled low at time $t_O+\Delta$ (316, 328/320, and 304/306).

With $\overline{DIN}$ at logic low level, the output of NAND gate 308 (node 310) remains high, and the output of inverter remains low. Thus, NMOS transistor 302 remains turned off. Of the three inputs to NAND gate 324, two remain high (AS and node 310). Three-inverter delay chain 326 inverts and delays the positive pulse at node 322 and applies it to the third input at node 336. Thus, NAND gate 324 receives a negative pulse at input 336, five gate delays after $t_O$ (316, 320, and 326) at time $t_O+5\Delta$. A positive pulse therefore arrives at the gate terminal of PMOS transistor 300 disconnecting I/O from VDD at time $t_O+6\Delta$. During write, AS·W is asserted high causing the output of inverter 342 to be low. The positive pulse on DIN at $t_O$ causes the output of gate 338 to go low at time $t_O+\Delta$, the output of gate 340 to go high at time $t_O+2\Delta$, and the output of inverter 344 to go low at time $t_O+3\Delta$. Thus, I/O floats for the duration of the pulse starting at time $t_O+6\Delta$, with transistors 300, 302 and EQ all off. During this time, $\overline{I/O}$ is pulled to ground to accomplish a write.

If the falling (trailing) edge of the DIN pulse occurs at time $t_1$, then NMOS transistor 306 turns off and PMOS transistor 304 turns on at time $t_1+2\Delta$ (316 and 328/320). Thus, $\overline{I/O}$ starts to move toward VDD at time $t_1+3\Delta$ (316, 328/320, and 304/306). The time $t_1+3\Delta$ marks the start of the recovery or equilibration process. NMOS transistor EQ which was turned off at time $t_O+3\Delta$, remains off for the duration of the DIN pulse, and is turned back on at time $t_1+3\Delta$ (338, 340, 344). The equilibration transistor is therefore turned on at the same time ($t_1+3\Delta$) that $\overline{I/O}$ starts to recover, moving from ground up toward VDD. With equilibration transistor EQ shorting I/O to $\overline{I/O}$, the previously high I/O line moves down toward the recovering $\overline{I/O}$ line as EQ helps PMOS transistor 304 pull the recovering $\overline{I/O}$ line high.

PMOS transistor 300, however, is turned off at this time. It is not turned back on until time $t_1+6\Delta$ (316, 320, 326, 324), pulling I/O up to VDD at time $t_1+7\Delta$. As a result, PMOS transistor 300 is off for four gate delays ($4\Delta$) after $\overline{I/O}$ has started the equilibration process. Thus, for the duration of $4\Delta$ after $\overline{I/O}$ starts the recovery, PMOS pull-up transistor 300 is turned off allowing I/O to drop down toward rising $\overline{I/O}$. As close as possible to the time that the falling I/O voltage meets the rising $\overline{I/O}$ voltage, PMOS 300 is turned back on, after which both I/O and $\overline{I/O}$ move toward VDD with the same time constant.

Figure 4A:
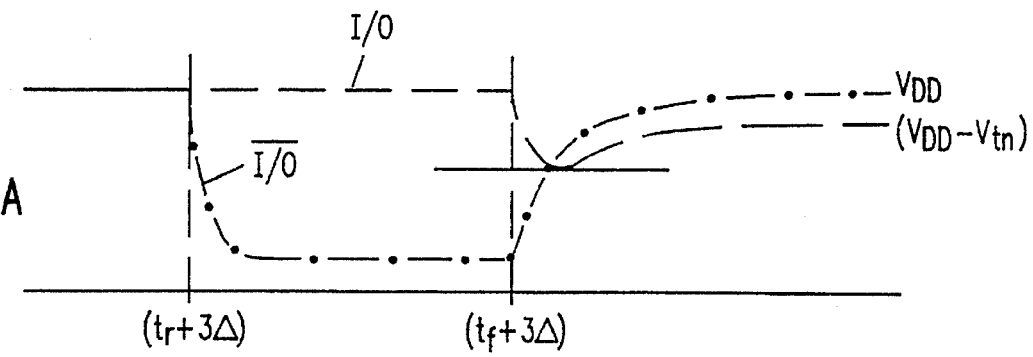
FIG. 4 made up of FIGS. 4a–4c is a timing diagram illustrating the waveform on the I/O data lines during memory write cycles according to the present invention.
Figure 4B:
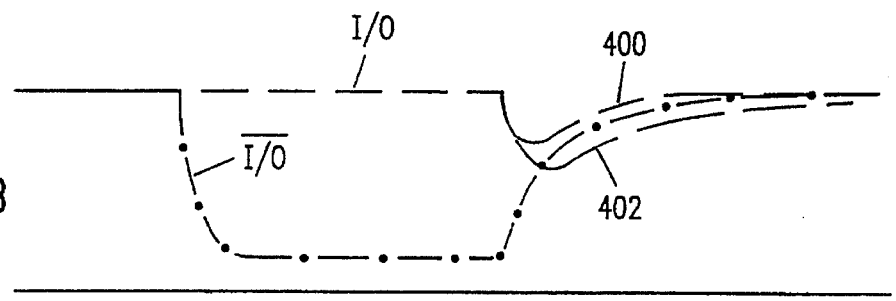
Figure 4C:
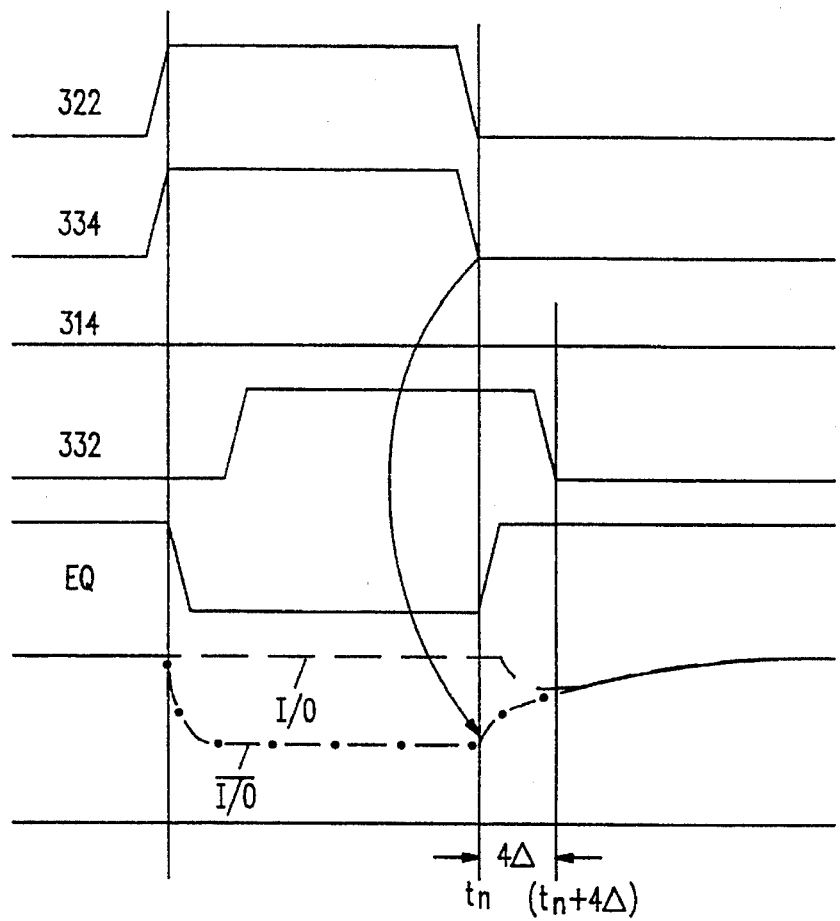

The time at which PMOS 300 is turned back on (i.e., the length of time PMOS transistor 300 remains off after $\overline{I/O}$ starts recovering) is very critical. This is shown in the timing diagram of FIG. 4. Diagram 4A shows the behavior of the I/O lines when writing a logic "1" in the case where PMOS 300 is not turned on at all during recovery of the $\overline{I/O}$ line. As explained above, at time $t_o+3\Delta$, $\overline{I/O}$ is pulled low to ground while I/O remains at VDD in order to write a logic "1" into an addressed memory cell coupled to the selected array. At time $t_1+3\Delta$, $\overline{I/O}$ starts its recovery up toward VDD, while current through the equilibration transistor EQ causes I/O to drop toward $\overline{I/O}$. If PMOS 300 is not turned back on after a short delay, I/O continues to equilibrate toward the voltage on $\overline{I/O}$, falling as long as $\overline{I/O}$ is below the voltage of I/O and then rising after the voltage on $\overline{I/O}$ exceeds the voltage on I/O. After the voltage on $\overline{I/O}$ exceeds the voltage on I/O, both I/O lines are pulled toward VDD by PMOS 304, $\overline{I/O}$ directly and I/O through equilibration transistor EQ. When I/O reaches one NMOS threshold voltage $V_{tn}$ below VDD (the gate voltage of NMOS equilibration transistor EQ), transistor EQ turns itself off, disconnecting I/O from $\overline{I/O}$. Thus, I/O reaches only VDD-$V_{tn}$, while I/O continues to exponentially approach VDD. This is clearly undesirable since a differential voltage of VDD-$V_{tn}$ remains across the I/O lines.

Diagram 4B illustrates the cases where PMOS transistor 300 is turned on before and after the optimum time in the same diagram. When PMOS 300 is turned on too early, it starts to pull I/O up toward VDD before I/O reaches I/O (i.e., while I/O is still above I/O). This is shown by line 400. When PMOS 300 is turned on too late, I/O crosses I/O before it (I/O) is pulled up toward VDD by PMOS 300. This is shown by line 402. In either case, a differential voltage is maintained across the I/O lines as they approach VDD. Note that an identical resistor/capacitor loading on the I/O lines results in equal RC time constants for the signals on the I/O lines.

Thus, the optimism time to turn PMOS 300 on is at the exact time when the I/O lines intersect. This will ensure that from the moment the I/O lines intersect (i.e., equilibrate) they both move toward VDD in unison with no differential voltage. Diagram 4C illustrates the timing of the control signals for the pull-up and pull-down transistors as well as the equilibration transistor coupled to the I/O lines and the signal on I/O lines when writing a logic "1". At time $t_n$, the gate terminals of the pull-up and pull-down transistors 304 and 306 (i.e., nodes 334 and 322) are pulled low, ending the write cycle and beginning the data line equilibration process. One inverter delay later, the gate terminal of the equilibration transistor EQ is pulled high to turn on transistor EQ. The gate terminal of the NMOS pull-down transistor 302 (node 314) remains low keeping the pull down transistor off. The gate terminal of pull-up transistor 300 (node 332) is high during the write pulse, disconnecting I/O from VDD, and remains high during the initial phase of recovery. Thus, at the start of recovery when transistor EQ is turned on, I/O rapidly drops down toward the recovering $\overline{I/O}$. About four gate delays later (time $t_n+4\Delta$) when the I/O lines intersect, node 332 is pulled low turning on pull-up transistor 300. From that point on, both I/O lines are pulled up by their respective pull-up transistors with identical rise times. Thus, equilibration is achieved and maintained as soon as the voltage on the data lines intersect.

Absolutely perfect timing of the re-enabling of PMOS transistor 300 is desirable but not necessary. With the knowledge of the equilibration technique of the present invention, a person skilled in this art could readily engineer the timing such that under all conditions the equilibration speed with this technique far exceeds that possible with prior art techniques.

The principal of operation of the circuit of FIG. 3 would be identical when writing a logic "0" with the roles of I/O and $\overline{I/O}$ reversed. Also, the exemplary value of four gate delays may vary depending on the design (transistor sizes), layout and fabrication process parameters of the circuit, but this was found to work extremely well for a specific application.

There are other embodiments of the present invention that take advantage of the ability to individually control the on/off timing of the gate terminals of the pull-up and pull-down transistors to obtain similar speed advantages for data line equilibration after a write cycle. In one alternative embodiment, instead of turning off the PMOS pull-up transistor connected to the high data line, the control circuit turns on the NMOS pull-down transistor connected to the high data line for a very short period of time right at the start of equilibration. That will cause the high data line to be pulled down toward the recovering data line, allowing the voltages to quickly equilibrate. This embodiment does not require an equilibration transistor, although the use of one is preferred. A third embodiment operates based on a combination of the other two embodiments. That is, the PMOS pull-up transistor connected to the high data line is turned off as in the first embodiment, and the NMOS pull-down transistor is turned on as in the second embodiment, simultaneously. Circuits similar to that shown in FIG. 3 can be developed to realize these alternative embodiments.

As is well known in the art of memory design, the polarities of the signals in the embodiment described are determined by the type of transistor used for the column decode transistors (110 in FIG. 1) in a DRAM device, or memory cell access transistors in an SRAM device. That is, since the embodiment described in connection with FIG. 3 assumes NMOS column decode transistors, the data lines are equilibrated at VDD. To write a logic "0" for example, the true data line (I/O) is pulled low, while its complement remains at VDD. However, if the column decode transistors (or memory cell access transistors in case of an SRAM) were PMOS type transistors, the data lines would be equilibrated at ground (or negative power supply voltage VSS). Then, to write a logic "0" the true data line (I/O) would be pulled high, while its complement ($\overline{I/O}$) would remain low. Thus, a control circuit similar to that shown in FIG. 3 operating based on the identical principals except with reversed polarities would obtain the same reductions in equilibration delay time after a write cycle.

In conclusion, the present invention provides several embodiments for a method and a circuit for fast equilibration of data lines following a write cycle in memory circuits. An I/O control circuit, separately controls the gate terminals of pull-up and pull-down transistors that are connected to the data lines. By separately controlling the on/off timing of these devices in such a way as to lower the voltage on the high data line, the circuit of the present invention achieves a data line equilibration time after a write cycle that can be even faster than that after a read cycle. While the above is a complete description of specific embodiments of the present invention, various modifications, variations and alternatives may be employed. For example, while the particular embodiment of the I/O control circuit described is based on a DRAM circuit, a similar circuit can be used in an SRAM device where data input and output typically take place on the same set of data lines. The circuit for an SRAM is similar to that shown in FIG. 1 without the memory cells 100, if one considers sense amplifier 105 as the SRAM memory cell flip-flop, decode transistors 110 as SRAM cell access transistors, and I/O data lines 108 as SRAM bit lines. The scope of this invention, therefore, should not be limited to the embodiments described, and should instead be defined by the following claims.

What is claimed is:

1. In a memory circuit, a data line control circuit comprising:

a first reference voltage;

a second reference voltage;

a first data line;

a second data line;

a first transistor coupled to the first data line for coupling the first data line to the first reference voltage;

a second transistor coupled to the first data line for coupling the first data line to the second reference voltage;

a third transistor coupled to the second data line for coupling the second data line to the first reference voltage;

a fourth transistor coupled to the second data line for coupling the second data line to the second reference voltage;

an equilibration transistor coupling said first data line to said second data line; and a write circuit having four output terminals coupled to control terminals of said first, second, third and fourth transistors, respectively, wherein, during a write cycle and in response to write data, the equilibration transistor is off and the write circuit turns on the second transistor to pull the first data line to the second reference voltage, and further wherein, during initial recovery of the first data line from the write cycle, the first transistor and the equilibration transistor are on, the second transistor and the third transistor are off.

2. The data line control circuit of claim 1 wherein the write circuit turns off the third transistor during the write cycle.

3. The data line control circuit of claim 1 wherein the write circuit momentarily turns off the third transistor immediately after the write cycle.

4. The data line control circuit of claim 1 wherein during recovery from the write cycle the write circuit turns on the third transistor at about the time the first and the second data lines reach substantially the same voltage level.

5. The data line control circuit of claim 1 wherein during the initial recovery from the write cycle the write circuit momentarily turns on the fourth transistor.

6. In a memory circuit, a data line control circuit comprising:

a first reference voltage;

a second reference voltage;

a first data line;

a second data line;

a first transistor coupled to the first data line for coupling the first data line to the first reference voltage;

a second transistor coupled to the first data line for coupling the first data line to the second reference voltage;

a third transistor coupled to the second data line for coupling the second data line to the first reference voltage;

a fourth transistor coupled to the second data line for coupling the second data line to the second reference voltage; and a write circuit having four output terminals coupled to control terminals of said first, second, third and fourth transistors, respectively, wherein, in a write cycle and in response to write data, the write circuit turns on the second transistor to pull the first data line toward the second reference voltage, and further wherein, during initial recovery from the write cycle, the second transistor is off, the first transistor is on, and the fourth transistor is momentarily on.

7. The data line control circuit of claim 6 wherein during recovery from the write cycle, the write circuit turns off the fourth transistor at about the time the first and the second data lines reach substantially the same voltage level.

8. In a memory circuit having a first data line coupled to a first and second reference voltages via a first and second transistors, respectively, and a second data line coupled to the first and second reference voltages via a third and fourth transistors, respectively, and an equilibration transistor coupled between the first and the second data lines, and wherein during a write cycle the second transistor turns on to pull the first data line to the second reference voltage, a method for equilibrating the voltage level on the first and second data lines after the write cycle, comprising the steps of:

(a) during the write cycle, or immediately after the write cycle during initial recovery, turning off the third transistor to decouple the second data line from the first reference voltage;

(b) during initial recovery immediately after the write cycle, turning on the first transistor;

(c) turning on the equilibration transistor to allow charge sharing between the first and the second data lines; and (d) turning on the third transistor about the time when the first and the second data lines are at substantially the same voltage level.

9. The method of claim 8 further comprising a step of momentarily turning on the fourth transistor to move a voltage level on the second data line closer to the second reference voltage during initial recovery from the write cycle.

10. The method of claim 9 further comprising a step of turning off the fourth transistor at about the time the first and the second data lines reach substantially the same voltage level during the recovery from the write cycle.

11. In a memory circuit having a first data line coupled to a first and second reference voltages via a first and second transistors, respectively, and a second data line coupled to the first and second reference voltages via a third and fourth transistors, respectively, and wherein during a write cycle the second transistor turns on to pull the first data line to the second reference voltage, a method for equilibrating the voltage level on the first and second data lines after the write cycle, comprising the steps of:

(a) during initial recovery immediately after the write cycle, turning on the first transistor; and (b) momentarily turning on the fourth transistor to move a voltage level on the second data line closer to the second reference voltage during initial recovery from the write cycle.

12. The method of claim 11 further comprising a step of: (c) during the write cycle, or immediately after the write cycle during initial recovery, turning off the third transistor to decouple the second data line from the first reference voltage.

13. The method of claim 11 further comprising a step of turning off the fourth transistor at about the time the first and the second data lines reach substantially the same voltage level during the recovery from the write cycle.

14. In a memory circuit having a first data line and a second data line, wherein during a write cycle a first circuit path is turned on to pull the first data line to a voltage level different than a voltage level on the second data line, a method for equilibrating the voltage levels on the first and the second data lines after a write cycle comprising the steps of:

(a) turning off the first circuit path;

(b) turning on a second circuit path coupling the first data line to a node other than the second data line, to pull the voltage level on the first data line toward the voltage level on the second data line; and (c) turning on a third circuit path coupling the second data line to a node other than the first data line, to pull the voltage level on the second data line toward the voltage level on the first data line.

15. The method of claim 14 further comprising a step of (d) turning off the third circuit path at about the time the first and the second data lines reach substantially the same voltage level.

16. In a memory circuit having a first data line and a second data line, wherein during a write cycle a first circuit path is turned on to pull the first data line to a first voltage level different than a second voltage level on the second data line, a method for equilibrating the voltage levels on the first and the second data lines after a write cycle comprising the steps of:

(a) turning off the first circuit path;

(b) turning on a second circuit path coupling the first data line to a node other than the second data line, to pull the voltage level on the first data line toward the voltage level on the second data line;

(c) turning on a third circuit path coupling the first data line to the second data line to allow charge sharing between the first and the second data lines; and (d) turning off a fourth circuit path coupling the second data line to the second voltage level to decouple the second data line from the second voltage level.

17. The method of claim 16 further comprising the step of (e) turning on the fourth circuit path at about the time the first and the second data lines reach substantially the same voltage levels.

18. In a circuit having a differential bus with a first data line and a second data line for differential transmission of data, wherein data is written on the differential bus by developing a differential voltage between the first and the second data lines by turning on a first circuit path that couples the first data line to a first voltage level different than a second voltage level on the second data line, a method for quilibrating the voltage levels on the first and the second data lines after a write step comprising the steps of:

(a) turning off the first circuit path;

(b) turning on a second circuit path coupling the first data line to a node other than the second data line, to pull the voltage level on the first data line toward the voltage level on the second data line;

(c) turning on a third circuit path coupling the first data line to the second data line to allow charge sharing between the first and the second data lines; and (d) turning off a fourth circuit path coupling the second data line to the second voltage level to decouple the second data line from the second voltage level.

19. The method of claim 16 further comprising the step of (e) turning on the fourth circuit path at about the time the first and the second data lines reach substantially the same voltage levels.

* * * * *